(12) United States Patent
Miller

(10) Patent No.: US 6,563,408 B1
(45) Date of Patent: May 13, 2003

(54) DIAGNOSTIC RELAY

(75) Inventor: Douglas Robert Miller, Dearborn Heights, MI (US)

(73) Assignee: Yazaki North America, Inc., Canton, MI (US)

( * ) Notice: Subject to any disclaimer, the term of this patent is extended or adjusted under 35 U.S.C. 154(b) by 0 days.

(21) Appl. No.: 09/907,820

(22) Filed: Jul. 19, 2001

(51) Int. Cl.[7] ............................................... H01H 67/02
(52) U.S. Cl. ............................ 335/128; 335/86; 335/83
(58) Field of Search ............................ 335/78–86, 124, 335/128

(56) References Cited

U.S. PATENT DOCUMENTS

| | | |
|---|---|---|
| 3,668,578 A | 6/1972 | Schroeder |
| 4,006,538 A | 2/1977 | Valentine |
| 4,254,316 A | 3/1981 | Landow |
| 4,311,961 A | 1/1982 | Holt et al. |
| 4,728,914 A * | 3/1988 | Morris et al. ................... 335/6 |
| 5,038,123 A * | 8/1991 | Brandon ....................... 335/128 |
| 5,106,327 A | 4/1992 | McAnelly et al. |

FOREIGN PATENT DOCUMENTS

JP          05081999          2/1993

* cited by examiner

Primary Examiner—Lincoln Donovan
(74) Attorney, Agent, or Firm—Daniel R. Edelbrock

(57) ABSTRACT

A diagnostic relay has a casing mounted on a relay base and enclosing components of the relay. The casing includes a top wall having a plurality of apertures. The apertures are aligned with contacts inside the casing. The contacts are integral with or electrically connected to relay prongs traversing the base. A diagnostician replaces a circuit relay with the diagnostic relay, then inserts probes of a circuit tester through selected apertures into engagement with the contacts to determine the location of faults in the circuit. In one embodiment, the casing is clear or transparent so the diagnostician may observe whether moving components of the diagnostic relay are operating properly.

4 Claims, 4 Drawing Sheets

DIAGNOSTIC RELAY

BACKGROUND OF THE INVENTION

1. Field of the Invention

This invention relates in general to electromagnetic relays and more specifically to a relay that aids in diagnosing circuit faults.

2. Discussion of Related Art

Relays are well known in the electrical art. A relay is an electromechanical switch. It operates by using relatively low electric current flowing in a first circuit to switch or direct the flow of a relatively higher electric current in a second circuit or multiple subsequent circuits. The object is to allow the use of a small amount of power in the first circuit to control a much greater amount of power in the subsequent circuit or circuits. Within the relay, an electromagnet is energized by the first circuit to exert an attraction force on an iron armature held adjacent the electromagnet. The armature overcomes the drag of a spring to move a contact to complete or break the second circuit. The spring returns the armature, and the connected contact, back to an original position when the electromagnet is de-energized.

Relay casings are often opaque and difficult or impossible to remove without destroying the relay. In order to diagnose a fault in a circuit that incorporates a relay, the service technician must test the relay in question to see if it is causing the fault. This is typically performed by either removing the relay from the circuit and plugging it into some kind of testing circuit, or substituting another, known to be functioning, relay. If the relay is not to blame the technician must probe each circuit individually for short and open circuits in a long and cumbersome process.

Some examples of prior art patents directed toward relay testing illustrate the lack of efficient and inexpensive field-testing available for relay circuits. A relatively large and complex relay tester for testing enclosed relays after a cover is affixed is set forth in U.S. Pat. No. 4,311,961. A stand has a jig for receiving a relay. A probe is inserted through an opening in a base of the relay into engagement with the movable contact of the relay. A microprocessor unit measures the electrical contact breaking force and probe displacement to determine whether contact travel is within set limits. U.S. Pat. No. 4,006,538 discloses an educational kit that allows a student to test relay control circuits and observe the operation of relay switches. Examples of devices that allow a kind of visual check of relay operation include U.S. Pat. No. 4,254,316. Transparent viewing members in a housing for contact modules receive reflected light indicating normal contact conditions. In U.S. Pat. No. 3,668,578, a transparent cover encloses the armature and contact assemblies of a relay to seal the elements from an outer environment. A separate, insulative cover encloses the electromagnet assembly.

SUMMARY OF THE INVENTION

Accordingly, it is an object of this invention to provide a relay for use in diagnosing faults in a relay circuit.

Another object of the invention is to make circuit elements of the relay easily accessible to a tester.

A further object of the invention is to enable movable physical components of the diagnostic relay to be observed and evaluated.

In carrying out this invention in the illustrative embodiment thereof, a diagnostic relay has holes or apertures extending through a top wall of its cover or casing. Upright contacts are used to extend the height of relay plugs or prongs through the casing to just under the apertures. This allows easy testing of each circuit in the relay. The service technician temporarily substitutes the diagnostic relay for the relay in the circuit. By temporarily replacing a particular relay in a circuit with the present invention, the service technician can electrically probe the circuits to find the fault by inserting leads of a multimeter through the apertures in the casing to engage the contacts. If the casing is opaque, markings on the casing may be used to identify the circuits. If the casing is transparent or clear, the operation of an armature assembly of the relay may be visually checked. The clear casing allows the technician to see if the armature assembly is operating properly. If the armature assembly does operate correctly and the circuits function as designed, then the problem is solved because the original relay was at fault. If the armature assembly does not operate properly, then the technician, using a schematic and the multimeter, can quickly check each circuit for expected voltage values and continuity, while keeping the whole system intact.

BRIEF DESCRIPTION OF THE DRAWINGS

This invention, together with other objects, features, aspects and advantages thereof, will be more clearly understood from the following description, considered in conjunction with the accompanying drawings.

DETAILED DESCRIPTION OF THE ILLUSTRATED EMBODIMENT

Figure 1:
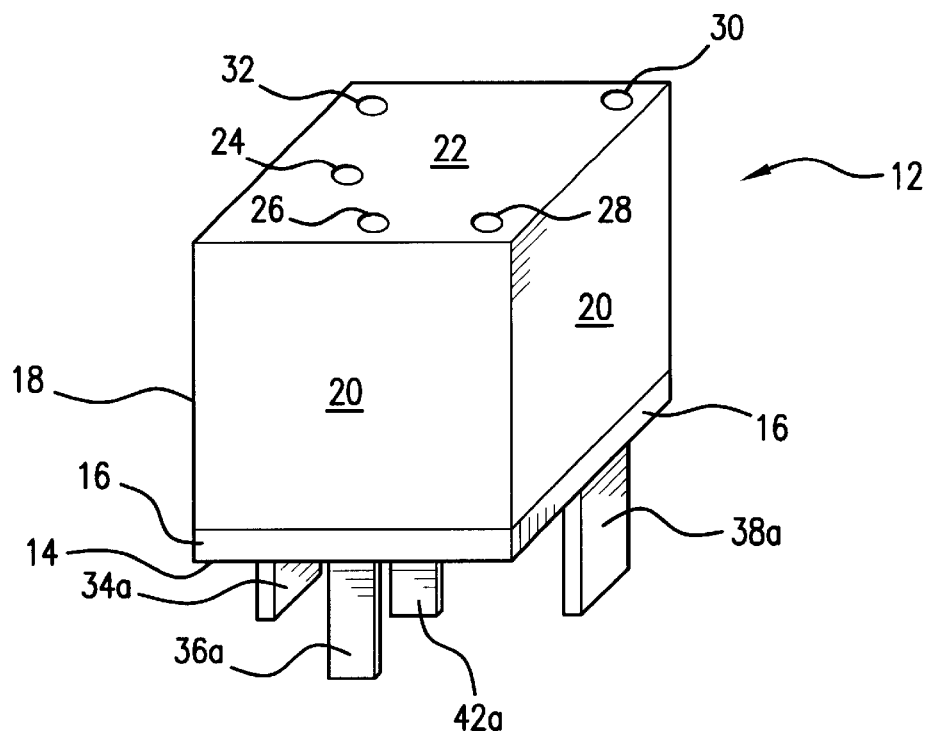
FIG. 1 is a perspective view of the diagnostic relay according to the present invention.

Referring now to FIG. 1, a diagnostic relay 12 according to the present invention has a rectangular plastic base 14 with four edges 16. A cover or casing 18 is attached to the base and has four side walls 20 and a top wall 22. The top wall 22 has five apertures 24, 26, 28, 30 and 32 extending through the top wall to an interior of the relay. The casing is illustrated as being made from an opaque plastic in FIG. 1, but alternatively may be clear or transparent plastic, as illustrated broadly in FIG. 7. In addition, the casing and base may be formed in a shape other than rectangular.

Figure 2:
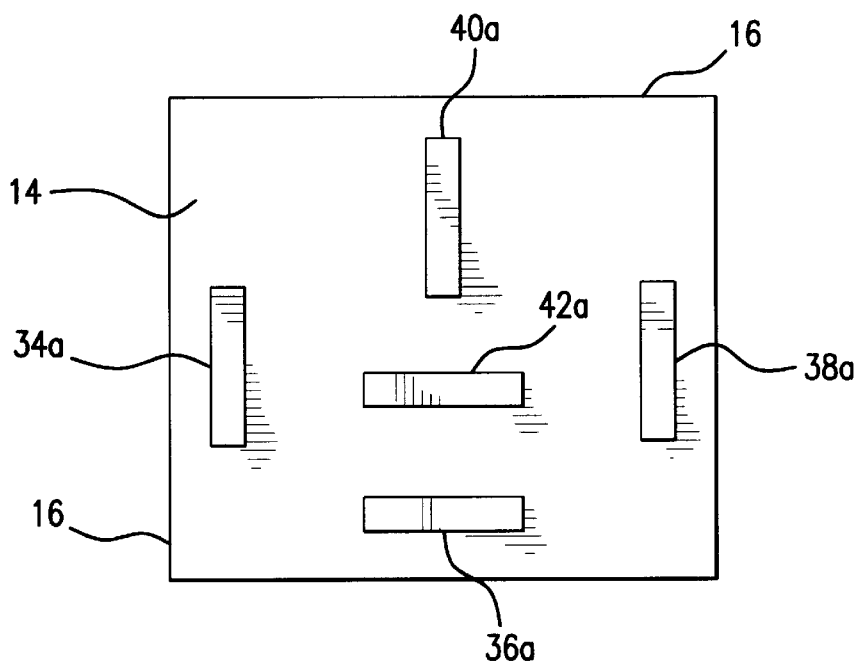
FIG. 2 is a bottom view of the relay showing a prong arrangement.

Five flat relay terminals or blades or prongs 34a, 36a, 38a, 40a and 42a extend from the interior of the relay through the base 14. As best shown in FIG. 2, the prongs are arranged in a specific footprint for insertion into similarly arranged receptacle slots through the surface of, for examples, a power distribution block, electrical junction box or circuit board. The prongs all extend in the same direction. Prongs 34a, 36a, 38a and 40a are each located adjacent an edge 16 of the base, with prong 42a in a more central position. In terms of width and length, prongs 34a, 38a and 40a are parallel to each other. Prongs 36a and 42a are parallel to each other and are oriented at right angles to prongs 34a, 38a and 40a. The lengths of prongs 34a, 36a and 38a are parallel to the closest edge of the base. There could be any number of circuits and prongs arranged in various desired footprints, as long as there is a corresponding number of apertures in the top wall of the casing. The relay footprint used as an example for this invention is one commonly employed in automotive applications.

Figure 3:
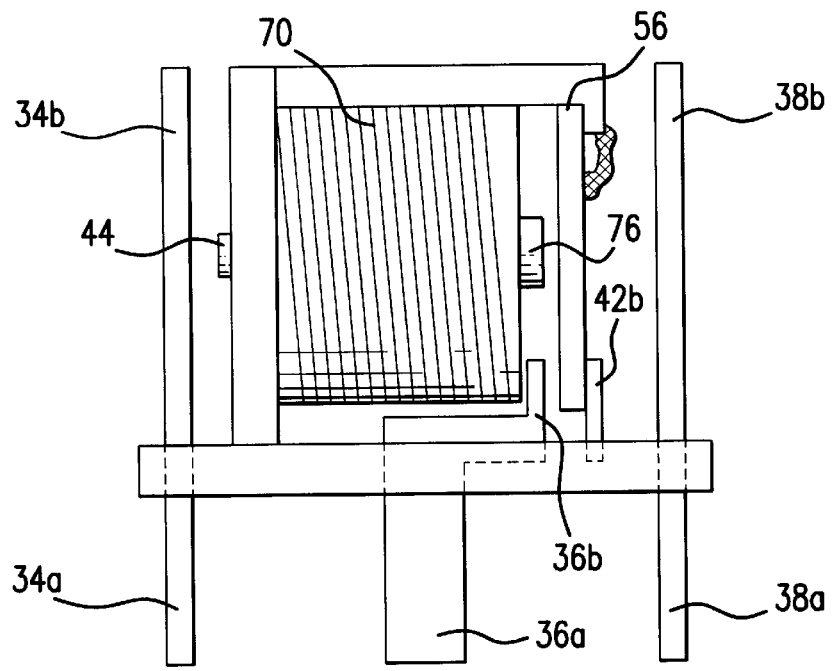
FIG. 3 is a front view of the relay with a casing removed.
Figure 4:
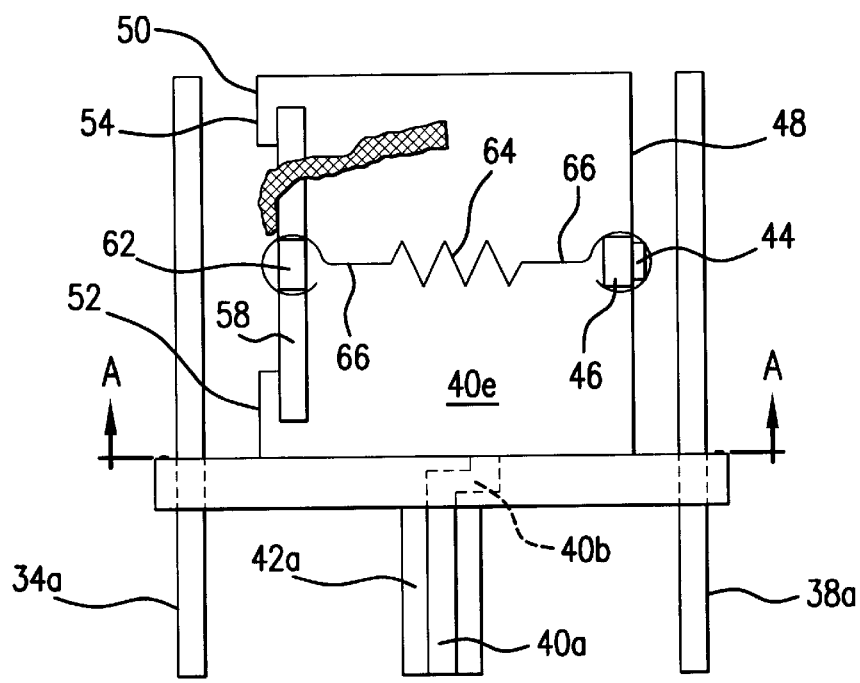
FIG. 4 is a rear view of the relay with the casing removed.
Figure 5:
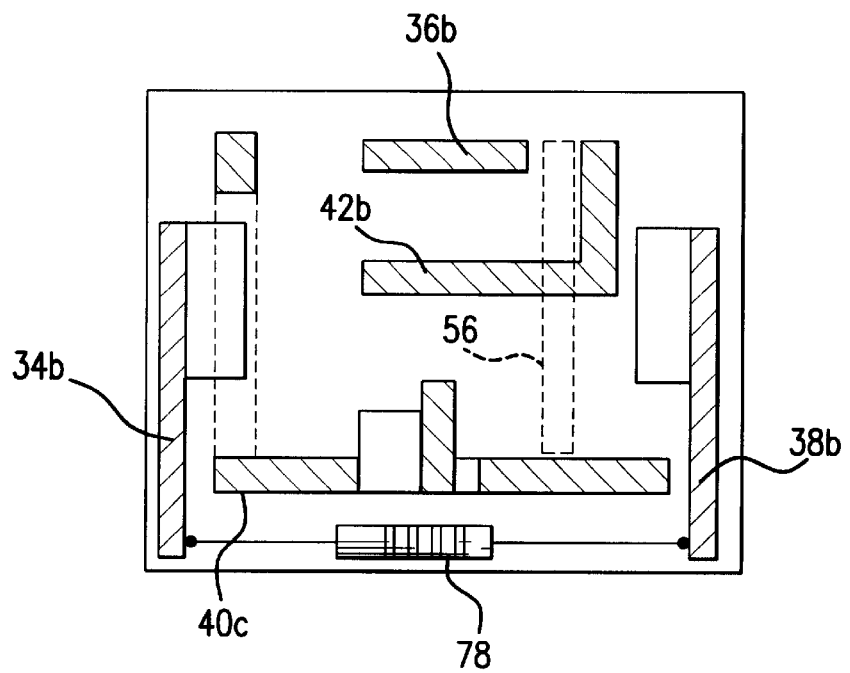
FIG. 5 is a section view of the relay taken along line A—A of FIG. 4.
Figure 6:
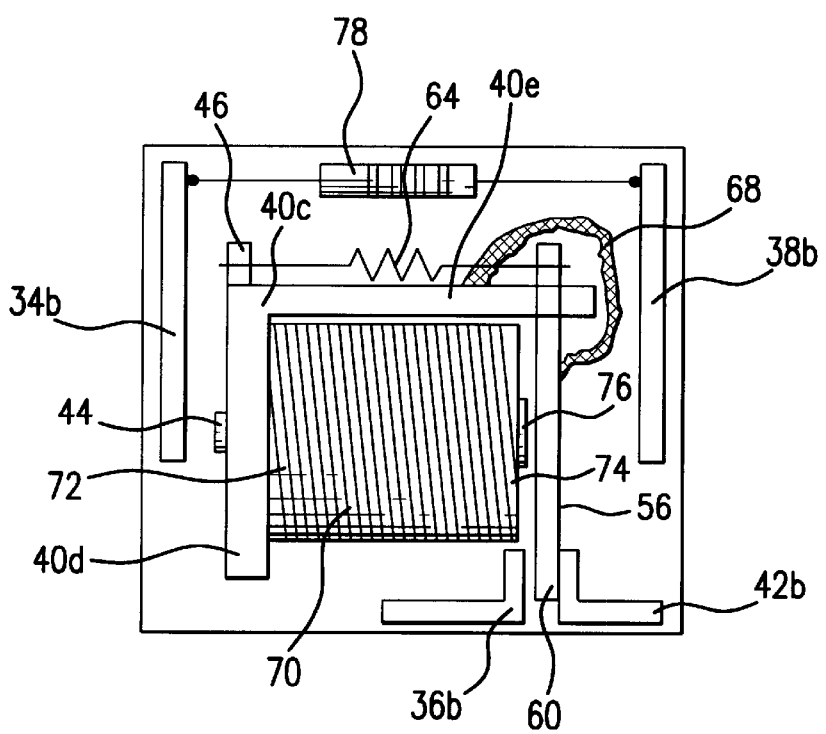
FIG. 6 is a top view of the relay with the casing removed.

FIGS. 3, 4 and 6 best illustrate the interior of the relay. The prong 40a is integral with or electrically joined by a bent portion 40b with a right-angled bracket 40c extending upright through the interior of the relay. The bracket has a first leg 40d and a second leg 40e extending at a right angle from the first leg. The first leg 40d has a centrally located cylindrical socket 44. The second leg 40e has a projection 46 adjacent a first edge 48 where it meets the first leg. At an opposite, second edge 50 the second leg 40e has lower and upper rails 52 and 54, respectively.

The rails 52 and 54 are designed to pivotally mount an armature 56 to the bracket 40c. The armature is a flat, rectangular plate of magnetically permeable and electrically conductive metal with a first end 58 notched to fit around the rails. A second end 60 of the armature has a lower portion that fits between contacts 36b and 42b. The contacts 36b and 42b are upright extensions of prongs 36a and 42a that extend into the interior of the relay. The contacts 36b and 42b are spaced apart a distance greater than a width of the armature 56 such that the armature can only be in physical engagement with one of the contact parts at any given time. A projection 62 extends from the first end 58 of the armature in the same direction that the projection 46 extends from the second leg 40e of the bracket 40c.

Figure 7:
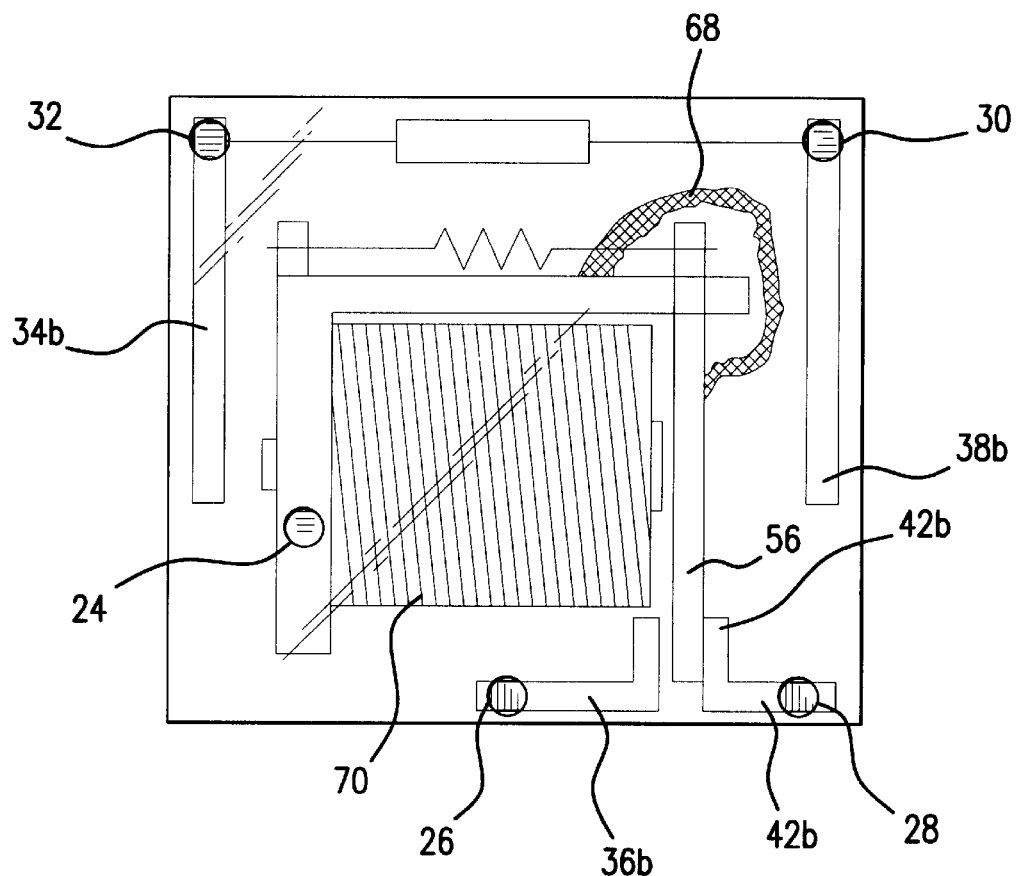
FIG. 7 is a top view of the relay illustrating a transparent casing with apertures enabling access to circuit contacts connected to the prongs.

A spring 64 has connection points 66 looped at each end for attachment to the projection 46 on the second leg 40e of the bracket 40c and the projection 62 extending from the first end 58 of the armature 56. In the compressed, at-rest, original state or position of the spring 64, the lower portion of the second end 60 of the armature is pressed against the contact 42b of the prong 42a as best shown in FIGS. 3, 6 and 7.

A flexible, movable braided wire 68 is soldered or otherwise attached at one end to the second leg 40e of the bracket 40c and at an opposite end to the armature 56. The braided wire ensures good electrical connection between the prong 40a and the armature 56 through the bent portion 40b and the second leg 40e of the bracket 40c.

The height of the bracket 40c is made tall enough to extend to the top wall 22 of the casing 18, or, alternatively, at least part of bracket 40c extends to that height. Contacts 36b and 42b extend upward from prongs 36a and 42a, respectively, to the height of bracket 40c. Contacts 34b and 38b extend upward from the prongs 34a and 38a, respectively, to the height of bracket 40c. The contacts may be integrally formed with the prongs or, alternatively, just electrically connected to them in some other conventional manner. In addition, they could be smaller in cross section to reduce weight and material cost. The top of bracket 40c and the contacts 34b, 36b, 38b and 42b act as circuit traces extending from the prongs. These circuit traces are accessible to probes of a multimeter or other circuit tester through the apertures in the top wall of the casing. The apertures are positioned in the top wall of the casing because it is often more easily reached than the side walls when the relay is mounted on, for example, a circuit board. However, the apertures can be placed in a location other than the top wall of the casing, as long as the contacts extend to that location. In FIG. 7, the casing is illustrated as being transparent. The aperture 24 enables access by a probe to contact or bracket 40c. The apertures 26, 28, 30 and 32 enable access to the contacts 36b, 42b, 38b and 34b, respectively.

An electromagnet coil 70 has a first end 72 adjacent the first leg 40d of the bracket 40c and a second end 74. A ferromagnetic core is retained within the center of the coil and forms the longitudinal axis of the coil 70. The core has protruding, reduced diameter posts at each end of the coil. One post (not shown) is received in the cylindrical socket 44, securing the coil to the first leg 40d. An opposite post 76 is spaced from the armature 56 when the coil 70 is in the unexcited state. In this unexcited state, the armature is in an original, at-rest position, pulled by the spring to pivot against the contact 42b. A resistor 78 extends between the contacts 34b and 38b of the prongs 34a and 38a, respectively.

In operation, when a relay or relay circuit is malfunctioning, the relay is removed from its receptacle slots and the diagnostic relay of this invention is plugged into the receptacle slots. For this example, prongs 34a and 38a comprise the energizing circuit. The resistor 78 between the contacts 34b and 38b is connected in parallel with the electromagnetic coil to dissipate the energy stored in the coil. The energy is stored when the coil is energized and dissipated through the resistor when the coil is de-energized. The relay coil 70 is connected to this circuit in the conventional way (not shown). In the unexcited or de-energized state, electric current is not flowing through this circuit. The prong 42a is connected, for example, to an empty receptacle slot providing an open circuit. The armature 56 is pulled by the spring 64 against the contact 42b of the prong 42a. In alternative types of circuits, prong 42a could be connected to a device or appliance and thus the relay could be used to shut off current to the device when the electromagnetic coil is energized.

In the excited or energized state, flow of low electric current through the circuit completed by prongs 34a and 38a energizes the electromagnetic coil. The core is magnetized. The post 76 attracts the armature 56 against the pull of the spring 64. The armature presses against the contact 36b of the prong 36a, completing the circuit formed by prong 40a, bent portion 40b, bracket 40c, braided wire 68, armature 56, and contact 36b of prong 36a and providing a relatively higher current to power whatever device or appliance is connected to that circuit. If the casing is transparent as illustrated in FIG. 7, a visual check of the movement of the armature 56 of the diagnostic relay is possible. Interruption of the electric current flow through prongs 34a and 38a de-energizes the coil. The post 76 loses its attraction force and the spring 64 pulls the armature back against ground contact 42b. Power is no longer directed to the appliance.

If the mechanical component of the relay is operating correctly and the circuitry malfunction is eliminated, one can assume this was the problem with the replaced relay. If there is still a fault, the circuitry is tested by the probes of a circuit tester inserted into the apertures 24, 26, 28, 30 and 32 through the top wall 22 of the casing 18. If the casing is opaque, the circuits could be identified by appropriate markings on the casing. The upright contacts 34b, 36b, 38b, 40c and 42b extending to the apertures 32, 26, 30, 24 and 28 respectively, enable each element or segment of the individual circuits to be tested.

In an automotive environment, for example, the diagnostic relay of this invention would have considerable value in dealership service departments. It could also be furnished to do-it-yourself consumers through retail outlets. Original equipment manufacturers may also consider using the diagnostic relay as a direct replacement of their regular relays, since the diagnostic relay executes an equal task in an easily testable design. Finally, suppliers offering electrical systems engineering to the original equipment manufacturers would find the diagnostic relay useful in debugging prototype circuits.

Since minor changes and modifications varied to fit particular operating requirements and environments will be understood by those skilled in the art, this invention is not considered limited to the specific examples chosen for purposes of illustration. The invention is meant to include all changes and modifications which do not constitute a departure from the true spirit and scope of this invention as claimed in the following claims and as represented by reasonable equivalents to the claimed elements.

What is claimed is:

1. An electromagnetic relay having terminals for completing or breaking electrical connection with electric circuits, the relay comprising:

a base, the relay terminals projecting from the base;

a casing enclosing the relay and having a wall opposite the base, the wall having apertures;

a plurality of extensions within the casing, each extension having a first portion aligned with and adjacent to one of the apertures in the casing wall and a second portion spaced from the first portion; and means for electrically connecting the second portion of each extension with one of the relay terminals, wherein the extensions are accessible by a circuit tester inserted through the apertures into engagement with the first portion of the extensions to test an associated electric circuit.

2. The electromagnetic relay of claim 1 wherein the casing is opaque.

3. The electromagnetic relay of claim 1 wherein the casing is clear.

4. The electromagnetic relay of claim 1 wherein the means for electrically connecting the second portion of each extension with one of the relay terminals is provided by having the extension formed integrally with the terminal.

* * * * *